United States Patent [19]
Thurgate et al.

[11] Patent Number: 6,147,907
[45] Date of Patent: Nov. 14, 2000

[54] BIASING SCHEME TO REDUCE STRESS ON NON-SELECTED CELLS DURING READ

[75] Inventors: Timothy Thurgate, Sunnyvale; Ravi Sunkavalli, Santa Clara, both of Calif.

[73] Assignee: Advanced Micro Devices, Inc., Sunnyvale, Calif.

[21] Appl. No.: 09/430,336

[22] Filed: Oct. 29, 1999

[51] Int. Cl.$^7$ .................................................. G11C 16/04

[52] U.S. Cl. .................. 365/185.18; 365/185.33

[58] Field of Search ................. 365/185.18, 185.33, 365/185.01, 185.03, 185.05, 185.26

[56] References Cited

U.S. PATENT DOCUMENTS 5,905,675  5/1999  Madurawe et al. ............... 365/185.18

Primary Examiner—David Nelms
Assistant Examiner—David Lam
Attorney, Agent, or Firm—H. Donald Nelson

[57] ABSTRACT

A method of reading a flash memory (EEPROM) device by applying zero volts to all bitlines and source terminals in the flash memory device. A negative voltage ($V_D$) is applied to all the substrate and all wordlines in the flash memory device. The negative voltage ($-V_D$) is applied to the bitline to which the drain of the cell being read is attached and applying a positive voltage ($V_G$) minus the voltage $V_D$ to the wordline to which the gate of the cell being read is attached.

4 Claims, 3 Drawing Sheets

BIASING SCHEME TO REDUCE STRESS ON NON-SELECTED CELLS DURING READ

BACKGROUND OF THE INVENTION

1. Field of the Invention

This invention relates generally to the art of microelectronic integrated circuits. More specifically, this invention relates to flash Electrically Erasable Programmable Read Only Memory (EEPROM) devices. Even more specifically, this invention relates to a method to read flash Electrically Erasable Programmable Read Only Memory (EEPROM) devices to reduce stress on non-selected cells during read.

2. Discussion of the Related Art

A microelectronic Electrically Erasable Programmable Read-Only Memory (Flash EEPROM) device includes an array of cells that can be independently programmed and read. The size of each cell and thereby the memory device are made small by omitting select transistors that would enable the cells to be erased independently. As a result all of the cells must be erased simultaneously as a block.

A memory of this type includes individual Metal-Oxide-Semiconductor (MOS) field effect transistor memory cells, each of which includes a source, drain, floating gate and control gate to which various voltages are applied to program the cell with a binary "1" or "0" or to erase all of the cells as a block.

The cells are connected in a rectangular array of rows and columns, with the control gates of the cells in a row being connected to a respective wordline and the drains of the cells in a column being connected to a respective bitline. The sources of the cells are connected together to a common source. This arrangement is known as a NOR memory configuration.

A cell is programmed by applying typically 8–9 volts to the control gate, approximately 5 volts to the drain and grounding the source, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

The cell is read by applying typically 5 volts to the control gate, 1–2 volts to the bitline to which the drain is connected, grounding the source, and sensing the bitline current. If the cell is programmed and the threshold voltage is relatively high ($\approx 4$ volts), the bitline current will be zero or at least relatively low. If the cell is not programmed or erased, the threshold voltage will be relatively low ($\approx 2$ volts), the control gate voltage will enhance the channel, and the bitline current will be relatively high.

A cell can be erased in several ways. In one arrangement, applying typically 12 volts to the source, grounding the control gate and allowing the drain to float erases a cell. This causes the electrons that were injected into the floating gate during programming to be removed by Fowler-Nordheim tunneling from the floating gate through the thin tunnel oxide layer to the source. Alternatively, applying a negative voltage on the order of minus 10 volts to the control gate, applying 5 volts to the source and allowing the drain to float can erase a cell.

FIG. 2 is a graph showing the change in the erase threshold voltage (Erase $V_t$) with the number of erase/program cycles. The cycling phenomenon is caused by the generation of hot-hole pairs resulting from band-to-band tunneling. Whereas Fowler-Nordheim tunneling from the floating gate through the tunnel oxide layer to the source results in erasure of a cell, band-to-band tunneling also occurs between the substrate and the source. When a positive voltage is applied to the source junction with the control gate negative, a deep depletion region is formed underneath the gate-to-source overlap region. The tunneling of valence band electrons into the conduction band generates electron-hole pairs. The source junction collects the electrons and the holes are collected by the substrate.

Since the minority carriers (holes) generated thermally or by band-to-band tunneling in the source region flow to the substrate due to the lateral field near the Si—$SiO_2$ interface, the deep depletion region remains present and the band-to-band tunneling can continue without creating an inversion layer. The generated holes gain energy because of the electric field in the depletion region. While the majority of these generated holes flow into the substrate, some of them gain sufficient energy to surmount the Si—$SiO_2$ barrier and are trapped in the tunnel oxide layer. This stress to the tunnel oxide layer in a particular bit is a cumulative effect and as shown in FIG. 2 the erase $V_t$ approaches the program $V_t$. As the erase $V_t$ approaches the program $V_t$ increasing numbers of electrons can flow into the floating gate whether or not the bit is programmed or erased. This phenomenon is termed bit charge gain and the floating gate can be eventually charged during a number of read operations causing the bit to change from an erased bit to a programmed bit. The dashed line 200 represents the critical value of the erase $V_t$ and indicates that when the erase $V_t$ approaches the region indicated by the dashed line 200 the device either fails or will fail soon. In the conventional method of reading a flash memory device, the relatively large voltage differential applied to all of the cells on the wordline on which the cell being read is located causes a relatively large bit charge gain. This means that all of the cells on the wordline are affected by stress whether or not they are being read and that each read operation can add to the transfer of electrons to each floating gate on the wordline on which the bit being read is attached. In order to decrease the bit charge gain and to extend the number of cycles before the device fails it would be advantageous to read the device with lower differential read voltages.

Therefore, what is needed is a method to read the flash memory device without unduly adding charge to the floating gate of cells being read and decreasing bit charge gain of the cells not being read.

SUMMARY OF THE INVENTION

According to the present invention, the foregoing and other objects and advantages are achieved by a method of reading a flash Electrically-Erasable Programmable Read Only Memory (EEPROM) that reduces stress on non-selected cells during read.

In accordance with an aspect of the present invention, zero volts is applied to all bitline and source terminals in the flash memory device. A negative voltage ($-V_D$) is applied to all the substrate and all wordlines in the flash memory device. The negative voltage ($-V_D$) is applied to the bitline to which the drain of the cell being read is attached and a positive voltage ($V_G$) minus the voltage $V_D$ is applied to the wordline to which the gate of the cell being read is attached.

The described method thus provides a method of reading a flash memory device that reduces stress on non-selected cells during read.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
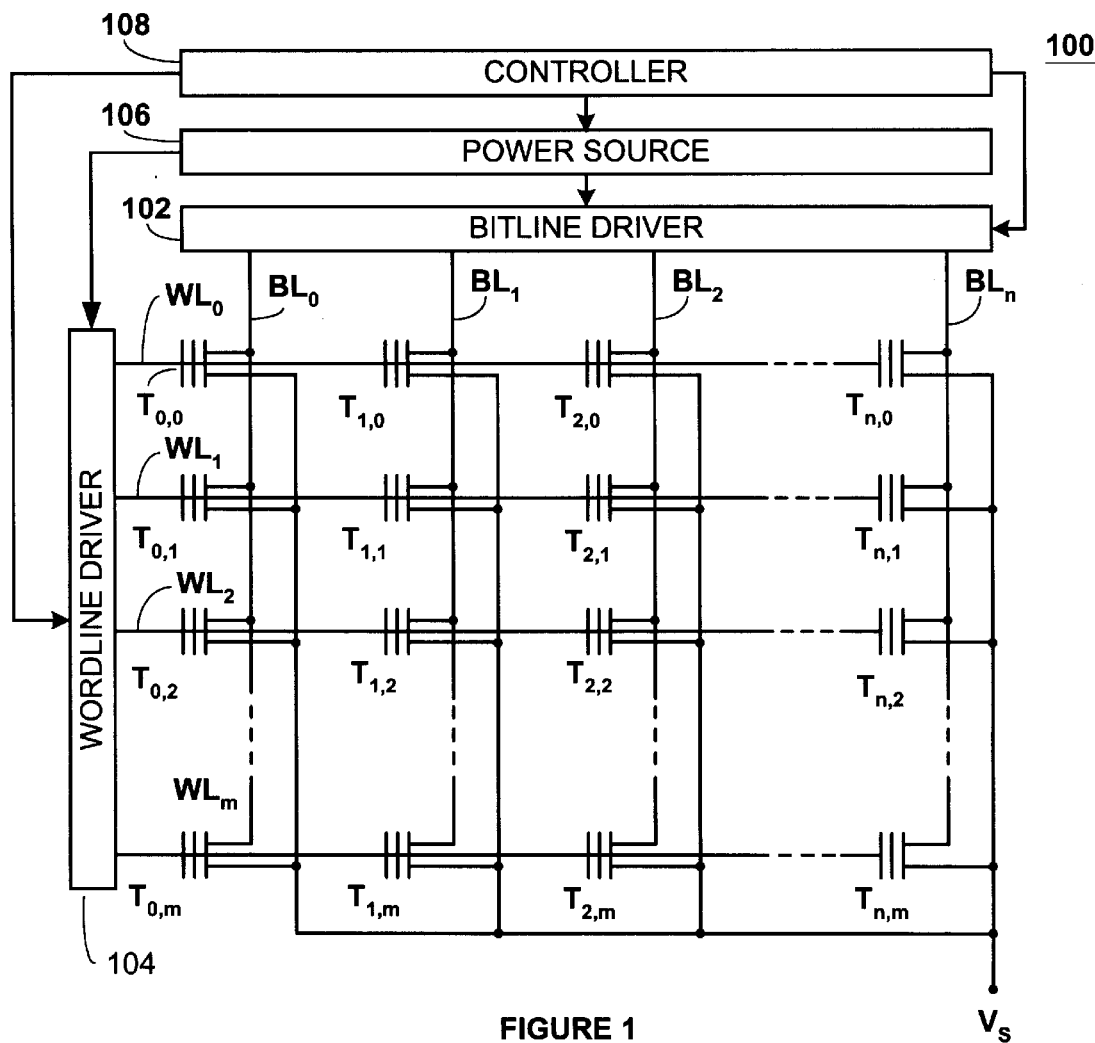
FIG. 1 is a simplified electrical schematic diagram of a flash EEPROM device showing an array of memory cells and control elements.

FIG. 1 illustrates the basic configuration of a NOR type flash Electrically Erasable Programmable Read-Only Memory (EEPROM) device 100 to which the present invention is advantageously applied. The memory device 100 is a plurality of core or memory cells that are arranged in a rectangular matrix or array of rows and columns. Each row is associated with a wordline, whereas each column is associated with a bitline. The sources of all of the memory cells are connected to a common terminal, $V_S$.

Assuming that there are n columns and m rows, the bitlines are designated $BL_0$ to $BL_n$ and the wordlines are designated as $WL_0$ to $WL_m$. A bitline driver 102 applies appropriate voltages to the bitlines, whereas a wordline driver 104 applies appropriate voltages to the wordlines. The voltages applied to the drivers 102 and 104 are generated by a power source or supply 106 under the control of a controller 108 that is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field-Effect-Transistor (FET) having a source, drain, gate oxide and control gate. The cells of a flash EEPROM differ from conventional FETs in that they additionally include a floating gate and tunnel oxide layer disposed underneath the control gate.

The cells illustrated in FIG. 1 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the common terminal $V_S$, which is connected to the power supply 106. The connection to the power supply 106 is not shown.

Programming a cell is achieved by applying typically 9 volts to the control gate of the cell, applying typically 5 volts to the drain of the cell and grounding the source of the cell, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

The prior art method of reading the cell is by applying typically 5 volts to the control gate of the cell, applying 1 volt to the bitline to which the drain of the cell is connected, grounding the source of the cell, and sensing the bitline current. If the cell is programmed and the threshold voltage is relatively high ($\approx 4$ volts), the bitline current will be zero or at least relatively low. If the cell is not programmed or erased, the threshold voltage will be relatively low ($\approx 2$ volts), the control gate voltage will enhance the channel, and the bitline current will be relatively high. Reading is preferably performed using sense amplifiers and a reference current array, the details of which are not the particular subject matter of the present invention.

A cell can be erased in several ways. In one arrangement, applying typically 12 volts to the source of the cell, grounding the control gate of the cell and allowing the drain of the cell to float erases the cell. These voltages cause the electrons that were injected into the floating gate of the cell during programming of the cell to be removed by Fowler-Nordheim tunneling from the floating gate of the cell through the thin tunnel oxide layer to the source of the cell. Alternatively, applying a negative voltage on the order of minus 10 volts to the control gate of the cell, applying 5 volts to the source of the cell and allowing the drain of the cell to float can also erase a cell.

Figure 2:
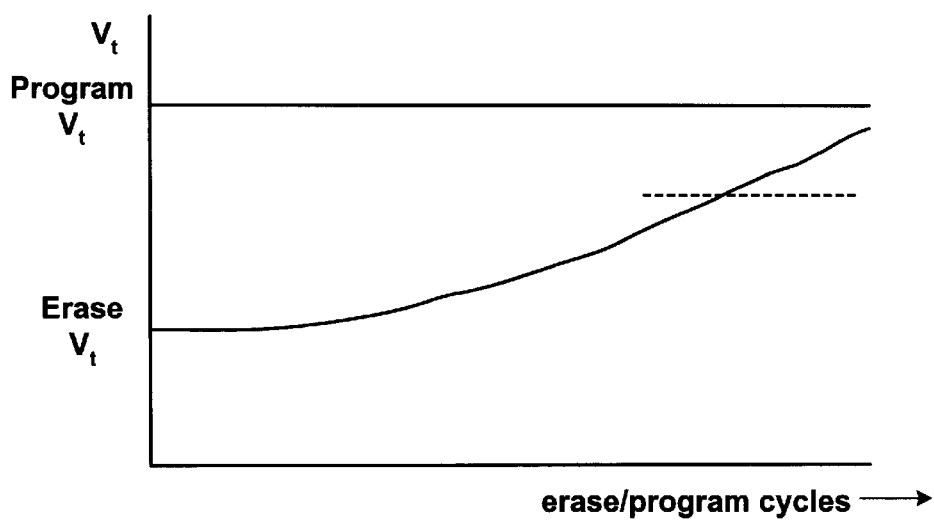
FIG. 2 is a graph showing the Program $V_t$ and Erase $V_t$ of a flash EEPROM cell versus the number of program/erase cycles.

As described above, FIG. 2 shows the change in the Erase $V_t$ of individual bits as the device is cycled through program/erase cycles. The upward trend of the Erase $V_t$ allows bit charge gain during read and when the Erase $V_t$ curve reaches the region delineated by dashed line 200 the device either fails or is about to fail due to the inadvertent programming of an erased bit during a read operation.

Figure 3:
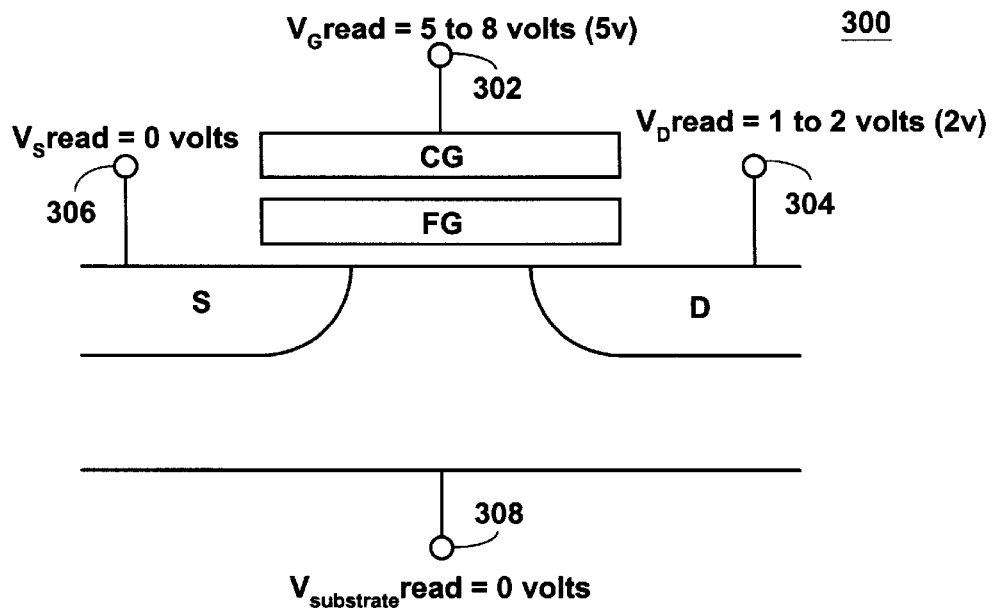
FIG. 3 shows a single flash memory cell with read voltages applied to the terminals of the flash memory cell in accordance with the prior art.

FIG. 3 shows a single flash memory cell 300 with read voltages applied to the terminals of the flash memory cell 300 during a read operation in accordance with the prior art. During read, a read voltage of from 5 to 8 volts is applied to the terminal 302 via the wordline attached to the gate of the cell being read. A read voltage of 1 to 2 volts is applied to the terminal 304 via the bitline attached to the drain of the cell being read. Zero voltage is applied to the source terminal 306 via a line that is attached to a common terminal. As is known in the flash memory art, all of the sources are connected to a common terminal. Zero voltage is applied to the terminal 308 that is connected to the substrate, which is also common to all the cells in the device. As can be appreciated, a voltage differential of from 5–8 volts is applied between the gate terminal and source terminal of all of the bits attached to the wordline of the cell being read. As discussed above, the relatively high gate-to-source voltage can cause electrons to be leaked to the floating gate during each read operation.

Figure 4:
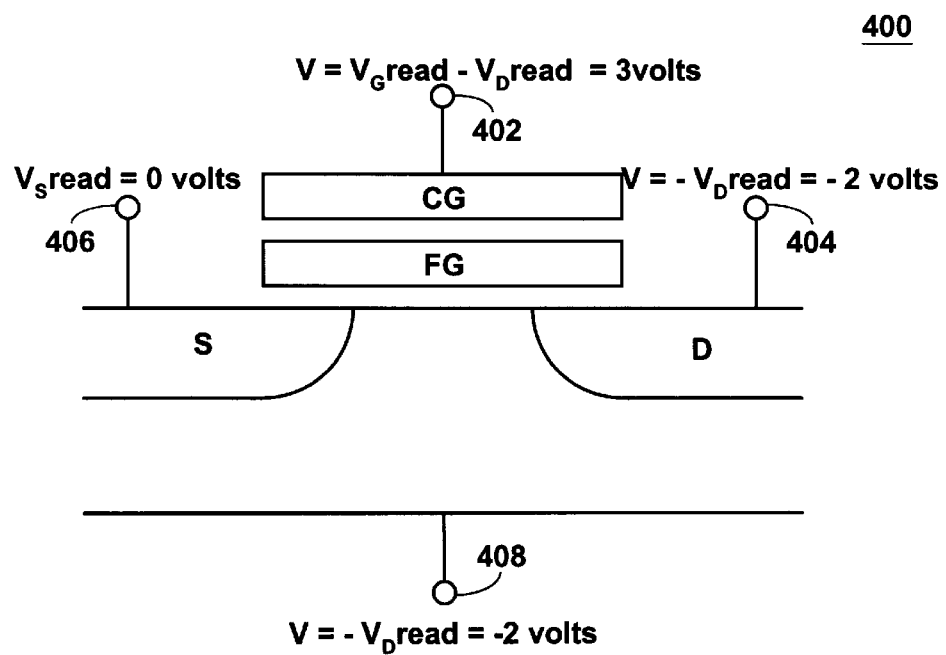
FIG. 4 shows a single flash memory cell with read voltages applied to the terminals of the flash memory cell in accordance with the present invention.

FIG. 4 shows a single flash memory cell 400 with read voltages applied to the terminals of the flash memory cell 400 during a read operation in accordance with the present invention. During read, a gate read voltage $V_G$read–$V_D$read is applied to the terminal 402 via the wordline attached to the gate of the cell being read. The voltage $V_G$read is the voltage that is conventionally applied to the wordline to which the gate of the cell being read is attached. The voltage $V_D$read is the voltage that is conventionally applied to the bitline to which the drain being read is attached. In this example, the voltage V applied to the terminal 402 could range from 3 to 7 volts and would preferably be at the lower end of the range to better prevent electrons from being transferred to the floating gate. During read, a drain read voltage of minus $V_D$read is applied to the terminal 404 via the bitline to which the drain of the cell being read is attached. In this case the voltage applied to terminal 404 can range from minus 1 to minus 2 volts. During read, a source read voltage of 0 volts is applied to terminal 406 via a line that is attached to a common terminal. During read, a substrate read voltage of minus $V_D$ volts is applied to terminal 408 that is attached to a common terminal.

Figure 5A:
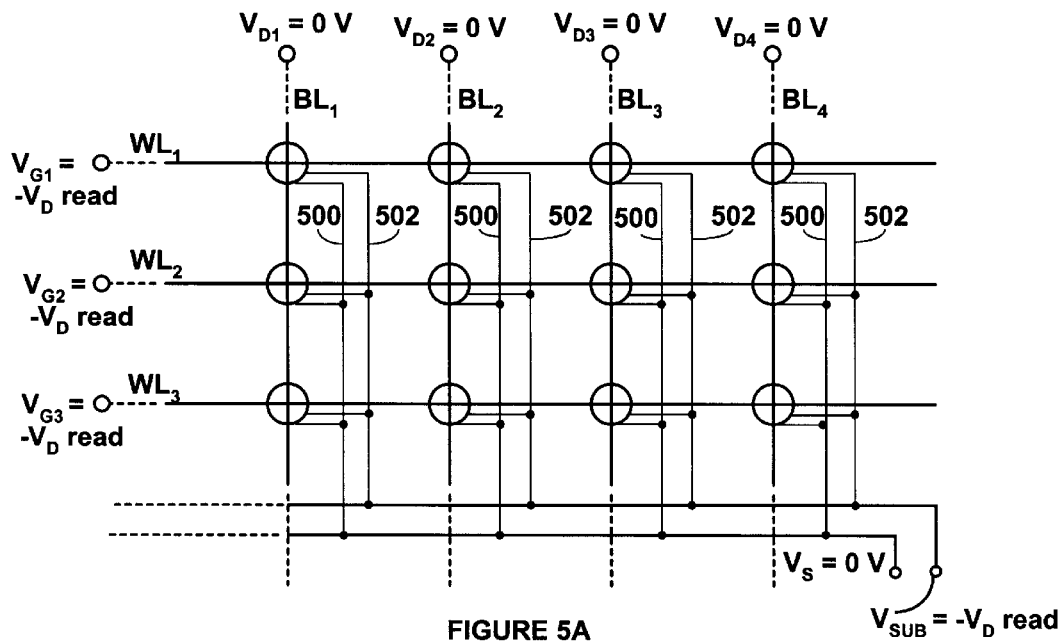
FIG. 5A is a simplified electrical schematic diagram of several flash EEPROM cells showing voltages applied to the terminals of all the flash memory cells during pre-read.

FIG. 5A is a simplified electrical schematic diagram of several flash EEPROM cells showing voltages applied to the terminals of several flash memory cells during a time prior to the read operation. Shown in FIG. 5A are three wordlines $WL_1$ through $WL_3$ and four bitlines $BL_1$ through $BL_4$. At the intersection of each wordline and each bitline is located a memory cell. Lines 500 connect the source of each cell to a common terminal $V_S$. Lines 502 connect the substrate of each cell to a common terminal $V_{substrate}$. During the pre-read all of the bitlines of the device, represented by $BL_1$ through $BL_2$ have 0 volts applied to the terminals $V_{D1}$ through $V_{D4}$. During the pre-read all of the wordlines of the device, represented by $WL_1$ through $WL_3$ have a voltage of minus $V_D$ applied to the terminals $V_{G1}$ through $V_{G3}$. Zero voltage is applied to the terminal $V_S$ and a voltage of minus $V_D$ is applied to the terminal $V_{sub}$.

Figure 5B:
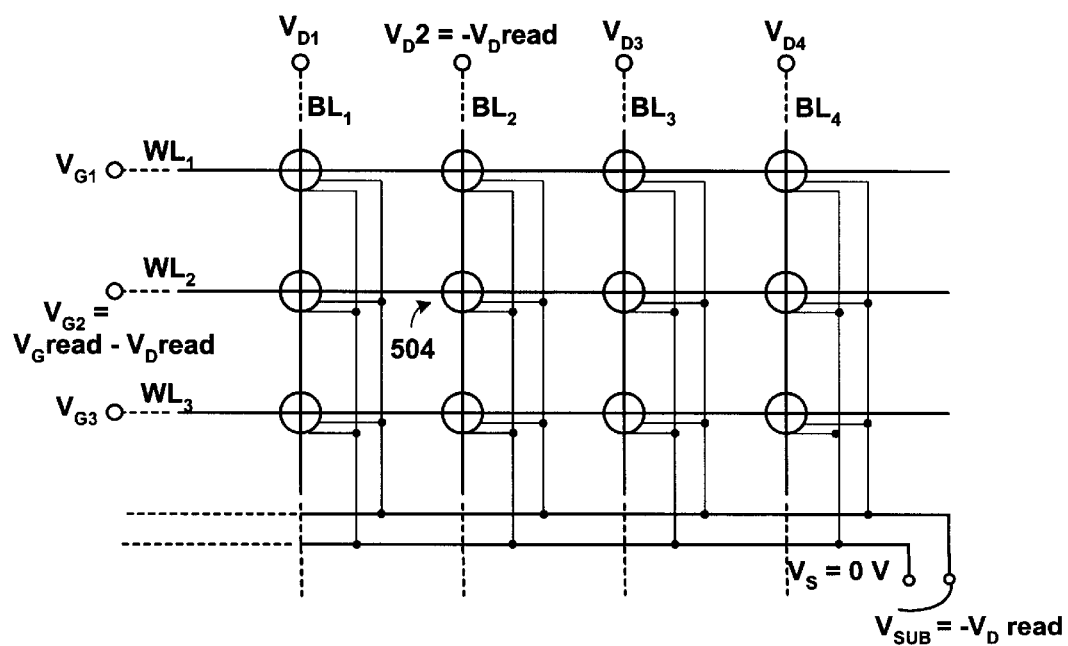
FIG. 5B is the simplified electrical schematic diagram of several flash EEPROM cells shown in FIG. 5A showing the voltages applied to the terminals of the flash memory cells during the reading of one of the flash memory cells.

FIG. 5B shows the simplified electrical schematic as shown in FIG. 5A showing voltages applied to the terminal of the several flash memory cells in order to read memory cell 504. A voltage of minus $V_D$ is applied to $BL_2$ and a voltage of $V_G$read minus $V_D$read is applied to $WL_2$ while the sources of all the bits are maintained at zero volts and the voltage of the substrate is maintained at minus $V_D$read.

In summary, the present invention overcomes the limitations of the prior art and fulfills the need for a method of reading a flash memory device that reduces stress on non-selected cells during read.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of reading a flash memory Electrically-Erasable Programmable Read-Only Memory (EEPROM) that includes a multitude of field effect transistor memory cells each having a source, drain, floating gate, control gate and a substrate, the method comprising:

(a) applying zero voltage to all bitlines in the flash memory device;

(b) applying a negative voltage ($-V_D$) to all wordlines in the flash memory device;

(c) applying zero volts to each source of the multitude of memory cells in the flash memory device;

(d) applying the negative voltage ($-V_D$) to each substrate of the multitude of memory cells in the flash memory device;

(e) applying the negative voltage ($-V_D$) to a bitline to which the drain of the cell to be read is attached; and (f) applying a positive voltage ($V_G$) minus the voltage ($V_D$) to a wordline to which the gate of the cell to be read is attached.

2. The method of claim 1 further comprising repeating steps (e) and (f) until all cells are read.

3. The method of claim 1 wherein step (b) is accomplished by applying a negative voltage ($V_D$) in the range of minus 1 volt to minus 2 volts.

4. The method of claim 1 wherein step (f) is accomplished by applying a positive voltage ($V_G$) in the range of 5 volts to 8 volts minus the voltage $V_D$.

* * * * *